US012710481B2

(12) United States Patent
Simonis et al.

(10) Patent No.: US 12,710,481 B2
(45) Date of Patent: Aug. 18, 2026

(54) METHOD AND APPARATUS FOR PROVIDING A PREDICTED AGING STATE OF A DEVICE BATTERY BASED ON A PREDICTED USAGE PATTERN

(71) Applicant: Robert Bosch GmbH, Stuttgart (DE)

(72) Inventors: Christian Simonis, Leonberg (DE); Parameswaran Krishnan, Ayalur (IN); Shi Li, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 538 days.

(21) Appl. No.: 18/186,782

(22) Filed: Mar. 20, 2023

(65) Prior Publication Data

US 2023/0305073 A1 Sep. 28, 2023

(30) Foreign Application Priority Data

Mar. 24, 2022 (DE) ..................... 10 2022 202 882.1

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
CPC ................ G01R 31/392; G01R 31/367; G01R 31/3646; G01R 31/382; G01R 31/385;

(Continued)

(56) References Cited

U.S. PATENT DOCUMENTS 8,200,600 B2 * 6/2012 Rosenstein .......... G01R 31/392 706/46
11,691,518 B2 * 7/2023 Holme .................... B60L 58/16 701/22

(Continued)

FOREIGN PATENT DOCUMENTS

DE 11 2019 003 222 T5 3/2021

OTHER PUBLICATIONS

M. Jafari, A. Gauchia, S. Zhao, K. Zhang and L. Gauchia, "Electric Vehicle Battery Cycle Aging Evaluation in Real-World Daily Driving and Vehicle-to-Grid Services," in IEEE Transactions on Transportation Electrification, vol. 4, No. 1, pp. 122-134, Mar. 2018 , doi: 10.1109/TTE.2017.2764320. (Year: 2018).*

(Continued)

*Primary Examiner* — Huy Q Phan
*Assistant Examiner* — Martin Walter Braunlich
(74) *Attorney, Agent, or Firm* — Maginot, Moore & Beck LLP

(57) ABSTRACT

A method for predicting an aging state of a device battery with at least one electrochemical unit includes providing a temporal operating variable profile of an operating variable of a device battery, determining successive cycles from the temporal operating variable profile, respectively assigning the determined cycles to predetermined cycle profiles so that a sequence of cycle profiles is obtained, determining a frequency distribution of transitions in the obtained sequence of cycle profiles in the form of a hidden Markov model, creating a predicted sequence of cycle profiles by successively, randomly selecting cycle profiles according to the frequency distribution of the transitions, assigning profile operating variable profiles assigned to the cycle profiles to the predicted sequence of cycle profiles to obtain a predicted operating variable profile, and determining a pre- (Continued)

dicted aging state or a predicted aging state profile based on the predicted operating variable profile using a predetermined aging state model.

11 Claims, 4 Drawing Sheets

(58) Field of Classification Search
CPC ........ G01R 31/389; H01M 2010/4271; H01M 10/48; B60L 58/10; H02J 7/005; H02J 7/0048
See application file for complete search history.

(56) References Cited

U.S. PATENT DOCUMENTS 11,987,147 B2 * 5/2024 Geantil ................. H01M 10/48
12,241,942 B2 * 3/2025 Lee .................... G01R 31/3842
2016/0023566 A1 1/2016 Lee
2016/0023567 A1 1/2016 Lee
2016/0041231 A1 2/2016 Lee
2020/0150185 A1 5/2020 Ramezan Pour Safaei et al.
2022/0200293 A1 * 6/2022 Lee ......................... H02J 7/005
2022/0252675 A1 * 8/2022 Ukumori ............... H02J 7/0047
2023/0288489 A1 * 9/2023 Jin ............................ B60L 3/12

OTHER PUBLICATIONS

J. Cao, D. Harrold, Z. Fan, T. Morstyn, D. Healey and K. Li, “Deep Reinforcement Learning-Based Energy Storage Arbitrage With Accurate Lithium-Ion Battery Degradation Model,” in IEEE Transactions on Smart Grid, vol. 11, No. 5, pp. 4513-4521, Sep. 2020, doi: 10.1109/TSG.2020.2986333. (Year: 2020).*

* cited by examiner

METHOD AND APPARATUS FOR PROVIDING A PREDICTED AGING STATE OF A DEVICE BATTERY BASED ON A PREDICTED USAGE PATTERN

This application claims priority under 35 U.S.C. § 119 to patent application no. 10 2022 202 882.1, filed on Mar. 24, 2022 in Germany, the disclosure of which is incorporated herein by reference in its entirety.

The disclosure relates to network-independently operated, electrical devices, in particular electrically drivable motor vehicles, in particular electric vehicles or hybrid vehicles, with device batteries and furthermore measures for determining a predicted aging state (state of health, SOH) of the device battery.

BACKGROUND

The supply of energy to network-independently operated, electrical devices and machines, such as electrically drivable motor vehicles, takes place by means of device batteries. The latter supply electrical energy for operating the devices.

Device batteries degrade over their service life depending on their load or usage. This so-called aging leads to a continuously decreasing maximum power or storage capacity. The aging state corresponds to a measure for indicating the aging of energy stores. According to the convention, a new device battery has an aging state with respect to its available capacity of 100%, which noticeably decreases over the course of its service life. A measure of aging of the device battery (change in the aging state over time) depends on an individual load on the device battery, i.e., in the case of vehicle batteries of motor vehicles, on the usage behavior of a driver, external ambient conditions and on the type of vehicle battery.

Although a physical aging state model can be used to determine the instantaneous aging state of the device battery based on historical operating variable profiles, this model is inaccurate in certain situations. This inaccuracy of the conventional aging state model complicates accurate state determination as well as the prediction of the aging state profile. However, a reliable prediction of the profile of the aging state of the device battery is an important option since it makes a determination of the residual service life and an economical assessment of a residual value of the device battery possible. Furthermore, the prediction of the aging state is of added value in order to plan and perform predictive maintenance intervals.

A prediction of the aging state can take place based on a predicted usage pattern generated from a historical usage pattern from the past. For this purpose, the thus predicted usage pattern is to be related to the usage behavior from the past in order to thus take into account the different types of use of the device battery.

SUMMARY

According to the disclosure, a computer-implemented method for providing a predicted profile of the aging state depending on a predicted usage pattern as well as a corresponding apparatus are provided.

Further embodiments are specified herein.

According to a first aspect, a computer-implemented method for predicting an aging state or an aging state profile of a device battery with at least one electrochemical unit in a technical device is provided, comprising the following steps:

- providing a temporal operating variable profile of at least one operating variable of the device battery;
- determining successive cycles, in particular operating cycles, rest cycles, and charging cycles, from the temporal operating variable profile for a predetermined previous period of time, wherein an operating variable profile in a predetermined time period is assigned to each cycle;
- respectively assigning the determined cycles to predetermined cycle profiles, which each characterize a type of use and/or an amount of a load on the device battery, so that a sequence of cycle profiles is obtained;
- determining a frequency distribution of transitions from one cycle profile to a subsequent cycle profile in the formed sequence of cycle profiles, in particular in the form of a hidden Markov model;
- creating a predicted sequence of cycle profiles by successively, randomly selecting (sampling) cycle profiles according to the frequency distribution of the transitions starting with the respectively most recently selected cycle profile,
- assigning profile operating variable profiles assigned to the cycle profiles to the predicted sequence of cycle profiles in order to obtain a predicted operating variable profile;
- determining a predicted aging state or a predicted aging state profile based on the predicted operating variable profile using an aging state model or range model.

Furthermore, the cycles can comprise operating cycles with a dynamic current flow caused by the operation of the device, with a quasi-continuously positive discharging current and, where applicable, short time periods of recuperation currents as well as rest cycles with a battery current of about 0A and charging cycles with a continuous charging current.

In particular, the cycle profiles can comprise one or more operating cycle profiles of different loads assigned to the operating cycles, and one or more charging cycle profiles of different loads assigned to the charging cycles. The operating cycles can include recuperation phases, where applicable.

The aging state of a device battery is usually not measured directly. This would require a number of sensors inside the device battery, which would make the production of such a device battery costly as well as complex and would increase the space requirement. Moreover, measurement methods suitable for everyday use for the direct determination of the aging state in the device batteries are not yet available on the market.

In the case of device batteries, the aging state (state of health, SOH) is the key variable to indicate a remaining battery capacity or remaining proportional range with a full battery charge. The aging state represents a measure of the aging of the device battery. In the case of a device battery or a battery module or a battery cell, the aging state can be indicated as a capacity retention rate (SOH-C). The capacity retention rate SOH-C is indicated as the ratio of the measured instantaneous capacity to an initial capacity of the fully charged battery and decreases with increasing aging. Alternatively, the aging state may be indicated as an increase in internal resistance (SOH-R) with respect to internal resistance at the start of the service life of the device battery. The relative change in the internal resistance SOH-R increases with increasing aging of the battery.

In a vehicle as a technical device, the predicted aging state may alternatively also be indicated in the form of a remaining residual range until a predetermined aging state limit is reached, the aging state limit determining an end time of the useful life of the vehicle battery as a device battery. The residual range can be determined by summing cycle ranges respectively assigned by to the cycle profiles.

The current aging state of a device battery is therefore generally determined using a battery model in a control device. This battery model is inaccurate in certain situations and usually has model deviations of up to more than 5%. Due to the inaccuracy of the battery model, the battery model can moreover only somewhat accurately indicate the instantaneous aging state of the energy storage and is not suitable for a prediction.

Furthermore, the determination of the predicted aging state or of the predicted aging state profile based on the predicted operating variable profile can be performed using an aging state model comprising an electrochemical model which is formed by a non-linear differential equation system and can be solved via time integration.

A physical aging model that evaluates continuous operating variables of the device battery, in particular by solving a differential equation system by means of a numerical time integration method, can be used for modeling and predicting an aging state for a device battery as an energy store. Based on the differential equation system, a change in the internal electrochemical states of the device battery can be simulated depending on a profile of the operating variables up to a time point (prediction horizon) and can indicate the physical aging state for a predicted time point.

In order to perform the time integration method, the operating variables, such as a battery current, a battery temperature, a battery voltage and a charging state, must be present as high-resolution time series. The aging state model based on a time integration method requires, for device batteries, at least the profiles of the battery current and the temperature. The furthermore required profiles of the battery voltage and of the charging state (SOC) can be measured or can be determined from the profiles of the battery current and of the temperature in a suitable manner using a battery performance model. These operating variables enter the aging state model as profile variables and thus enable the determination of an aging state. It is thus necessary to first analyze an operating variable profile in the past so that corresponding artificial operating variable profiles can be created for the future.

Furthermore, the aging state model can be supplemented with a data-based correction model so that a hybrid data-based aging state model with a probabilistic or artificial intelligence-based regression model, in particular a Gaussian process model, is formed. The data-based correction model can be trained on the residual of the physical aging state model in order to correct the aging state obtained by the physical aging model. For this purpose, there are consequently a data-based correction model of the aging state for correcting the SOH-C and/or at least one further model for correcting the SOH-R. Possible alternatives to the Gaussian process are further supervised learning methods, such as those based on a random forest model, an AdaBoost model, a support vector machine, or a Bayesian neural network.

Aging state models for determining aging states for electrical energy stores can thus be provided in the form of a hybrid aging state model, i.e., a combination of a physical aging model with a data-based correction model. In a hybrid model, a physical aging state can be determined by means of a physical or electrochemical aging model, and a correction value resulting from a data-based correction model can be applied to said aging state, in particular by addition or multiplication.

In order to model an aging state of a device battery using a physical or electrochemical aging state model and an optional more precise specification by a data-based correction model (i.e., a hybrid aging state model in combination), it is necessary to provide the time profiles of operating variables at relatively high frequency. These time profiles of the operating variables must furthermore be provided as seamlessly as possible for the required accuracy requirements in order to determine the aging state at a current time point.

Based on such a physical aging model or a hybrid aging state model, a current aging state of the considered device battery as well as predicted aging states can be created based on predicted operating variable profiles representing a projected load of the device battery. For example, the residual service life of the device battery can be determined to be a period until an end of service life, which indicates a time point at which the predicted aging state falls below a predetermined threshold value which indicates the end of service life, such as SOH-C=0.8, and, e.g., corresponds to a manufacturer's warranty limit.

It can be provided that the device battery is operated depending on the profile of the predicted modeled aging state, wherein, in particular, a residual service life of the device battery is signaled depending on the profile of the predicted modeled aging state. Furthermore, the planning and performance of predictive inspection and maintenance intervals can be provided on the basis of the aging prediction.

Furthermore, it can be provided that depending on the residual service life, the number of remaining rapid charging cycles is increased or decreased, or an adjustment of the operating limits (current limitation) or operating strategy takes place, e.g., with regard to thermal management (derating). Furthermore, the charging strategy can be adjusted depending on aging or depending on a predicted aging state profile. For this purpose, rapid charging cycles can be permitted or blocked depending on whether the number of remaining rapid charging cycles has been reached.

The calculation of such a physical aging model is complex and is generally not carried out in a control device of the technical device due to a lack of computing capacities. In this respect, the evaluation can be performed in a central unit that is remote from the technical device and is in communication connection therewith.

In order to predict the aging state profile, it is necessary when using an aging state model based on a time integration, to predict the operating variable profiles with a high temporal resolution into the future. This is not about accurately predicting the actual operating variable profiles, but rather the predicted operating variable profiles should extrapolate the load pattern that was demonstrated in the use of the device battery in the past, into the future. In order to obtain as accurate an aging state profile as possible and an accurate determination of the residual service life of the device battery, the provision of operating variable profiles corresponding to a load pattern equivalent to the past is therefore essential.

The predicted load pattern, which is indicated by predicted operating variable profiles, is created according to the above method according to a probabilistic load pattern model. The probabilistic load pattern model can be created as a hidden Markov model (HMM), wherein cycle profiles of a particular mode of operation of the device battery represent nodes that are interconnected via edges, to each of which is assigned a transition probability. This probabilistic load pattern model is created based on historical operating variable profiles for a predetermined previous period of time, which are analyzed with regard to cycles of predetermined successive time periods. For example, these time periods can be periods of between 1 and 10 min. A sampling or simulation via HMM is also possible at a significantly lower frequency and can take place, for example, once per hour up to 6 times per day. In this respect, user decisions are rather to be modeled or simulated, which describe use scenarios (parking, charging, driving) and thus have a direct effect on the time series of the load profiles.

In detail, sequences of individual cycles, which represent operating variable profiles for a corresponding time period, are now determined from the historical operating variable profiles. The time periods can have a predetermined duration.

Cycle profiles, such as operating cycles with different loads, rest cycles and charging cycles for different charging powers, are provided. In particular, the cycle profiles can comprise one or more operating cycle profiles assigned to the operating cycles, one or more rest cycle profiles assigned to the rest cycles, and one or more charging cycle profiles assigned to the charging cycles, which respectively differ from one another by the type of load on the relevant device battery.

Each of the cycles is then assigned to a predetermined cycle profile. This can take place using a rule-based classification method so that each of the time periods is assigned to a corresponding cycle profile according to a maximum possible similarity so that a sequence of cycle profiles is formed. For example, for the assignment to a cycle profile, the classification method can use the average charging or discharging currents and the range of an average battery temperature during the cycle. For this purpose, for load features that can represent aggregated variables from the operating variable profiles, load ranges that are respectively assigned to a cycle profile can respectively be provided so that an assignment of the cycles to cycle profiles can be performed by aggregating operating variables to form load features and assigning the load features to the load ranges assigned to the corresponding cycle profile.

Alternatively, the respective assignment of the determined cycles to cycle profiles can take place using a rule-based classification method or a clustering method based on load features, wherein the load features comprises at least one aggregated variable from the operating variable profiles of the respective cycle.

The sequence of the cycle profiles for the predetermined period of time thus results in the transition probabilities from one cycle profile to the subsequent cycle profile based on the frequencies of particular transitions from one cycle profile to a subsequent cycle profile. The hidden Markov model is created therefrom.

In particular, the cycle profiles can comprise one or more operating cycle profiles, which differ from one another with respect to their average Ah throughput for the time period, the maximum discharging current, an indication of a frequency of change, e.g., determined using a wavelet transformation, as load features and the like; one or more charging cycle profiles, which differ from one another with regard to their charging current, charge stroke and the like as load features; one or more rest cycles, which are characterized by the lack of a significant current drain or supply into the device battery and differ from one another with regard to the average battery temperature and the like as load features.

By analyzing the operating variable profiles, a sequence of the individual cycle profiles can thus be created and a hidden Markov model with probabilistic transition probabilities can be determined therefrom.

It can be provided that for determining the frequency distribution of transitions from one cycle profile to a subsequent cycle profile in the formed sequence of cycle profiles, a hidden Markov model is created in which cycle profiles form nodes that are interconnected via edges, to which are assigned frequencies of transitions from one cycle profile to a subsequent cycle profile.

In operation, the hidden Markov model is continuously updated with respect to the current operating variable profiles for each individual vehicle in the central unit. For this purpose, the end of the predetermined period of time is always defined with respect to a current time.

For performing an aging state prediction, operating variable profiles are now predicted starting with the current state of the aging state model.

For this purpose, a sequence of predicted cycle profiles is sampled from the hidden Markov model in that the respectively next cycle profile is predicted by random selection according to the transition probabilities based on the most recently determined cycle profile. This is performed up to a prediction horizon, which indicates the future time until which the prediction is to last.

For each of the cycle profiles, a profile of one or more operating variables or one or more load variables, for example a battery current and a battery temperature, is constructed using a load pattern model. If load variables are determined, they can be used to generate further operating variable profiles, in particular using a battery performance model. Profiles of the load variables of the battery current and of the battery temperature can thus be used to determine profiles of a battery voltage and a charging state.

It can be provided that the profile operating variable profiles assigned to the cycle profiles respectively correspond to the operating variable profile of the most recent cycle assigned to the relevant cycle profile.

Alternatively, the profile operating variable profiles assigned to the cycle profiles can respectively correspond to or be derived from the operating variable profile of the cycle assigned to the relevant cycle profile and closest to the centroid of the associated cluster.

It is thus provided to assign a profile operating variable profile corresponding to an artificial predicted operating variable profile to each of the predefined cycle profiles. For example, the assigned profile operating variable profiles can each correspond to the operating variable profile that, as a cycle, was most recently assigned to the corresponding cycle profile. Alternatively, each cycle profile can be assigned the profile operating variable profile closest to the centroid of the cluster formed by the corresponding cycles in the case of a cluster of cycles assigned to the relevant cycle profile.

By concatenating profile operating variable profiles according to the sequence of the cycle profiles, a predicted operating variable profile or first a predicted load variable profile and therefrom a predicted operating variable profile can be created. The predicted operating variable profile indicates a possible, artificially generated operating variable profile that best simulates, in an extrapolation of the usage behavior of the device battery, a cyclic aging resulting therefrom.

BRIEF DESCRIPTION OF THE DRAWINGS

Embodiments are described in further detail below with reference to the accompanying drawings. The figures show.

DETAILED DESCRIPTION

In the following, the method according to the disclosure is described with reference to vehicle batteries as device batteries in a multitude of motor vehicles as similar devices. In the motor vehicles, a data-based aging state model for the respective vehicle battery can be implemented in a control unit. As described below, the aging state model can be continuously updated or re-trained in an off-board central unit based on operating variables and/or features of the vehicle batteries from the vehicle fleet. The aging state model is operated in the central unit and used for aging calculation and aging prediction.

The above example is representative of a multiplicity of stationary or mobile devices with a network-independent energy supply, such as vehicles (electric vehicles, pedelecs, etc.), systems, machine tools, household appliances, IOT devices, and the like, which are connected via a corresponding communication connection (e.g., LAN, Internet) to an external central unit (cloud).

Figure 1:
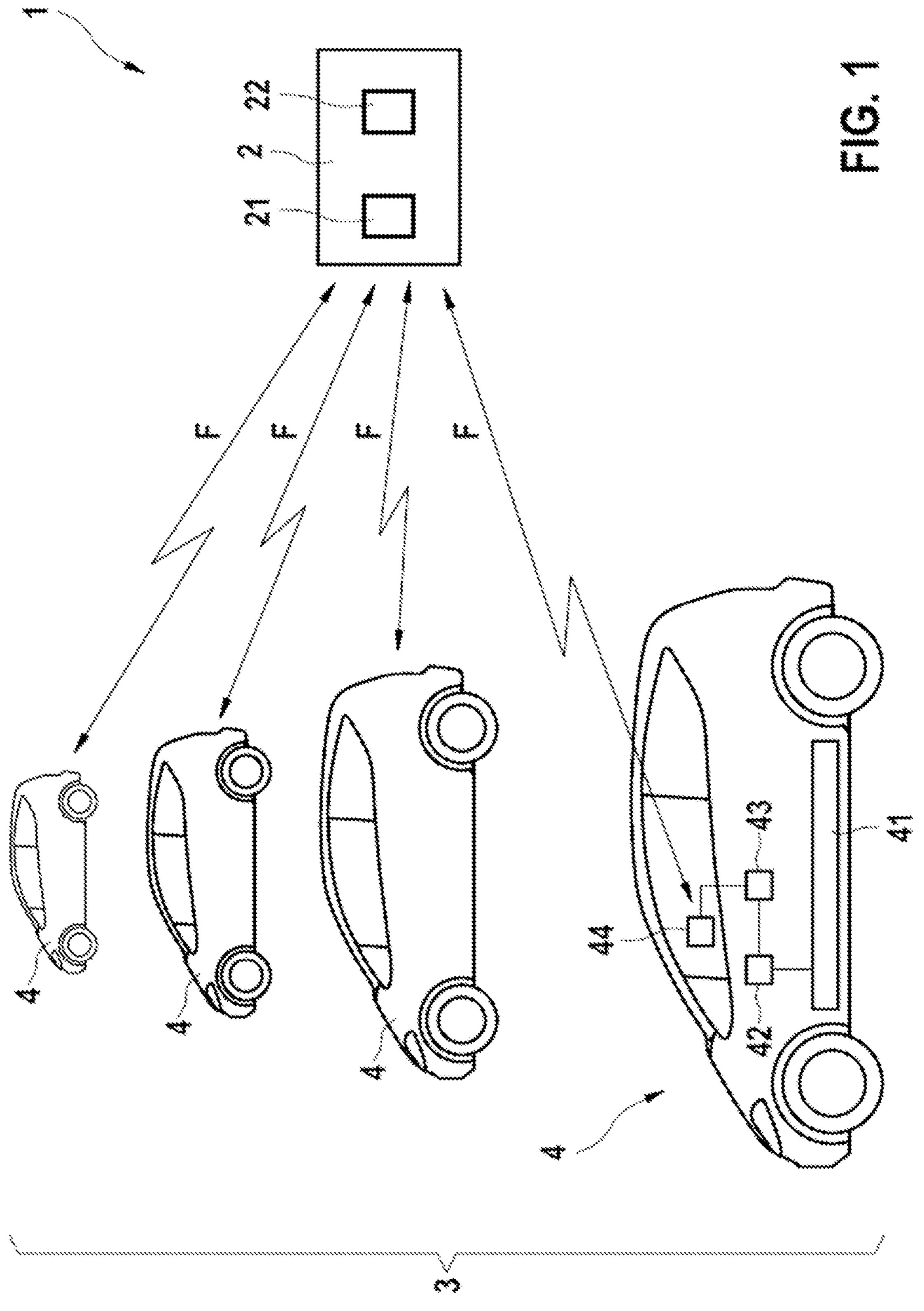
FIG. 1 a schematic illustration of a system for providing driver-specific and vehicle-specific operating variables for predicting an aging state of a vehicle battery in a central unit.

FIG. 1 shows a system 1 for collecting fleet data in a central unit 2 for creating and for operating as well as for evaluating an aging state model. The aging state model is used to determine an aging state of a vehicle battery 41 in a motor vehicle 4. FIG. 1 shows a vehicle fleet 3 with a plurality of motor vehicles 4.

One of the motor vehicles 4 is shown in more detail in FIG. 1. The motor vehicles 4 each comprise a vehicle battery 41 as a rechargeable electrical energy store, an electric drive motor 42 and a control unit 43. The control unit 43 is connected to a communication module 44, which is suitable for transmitting data between the respective motor vehicle 4 and a central unit 2 (a so-called cloud).

The motor vehicles 4 send to the central unit 2 the operating variables F, which indicate at least variables that influence the aging state of the vehicle battery 41. In the case of a vehicle battery, the operating variables F can time series of a battery current, a battery voltage, a battery temperature and a charging state (state of charge, SOC), at the pack, module and/or cell level. The operating variables F are captured in a fast time grid of 1 Hz to 100 Hz and can be transmitted regularly to the central unit 2 in uncompressed and/or compressed form.

Furthermore, by using compression algorithms, the time series can be transmitted to the central unit 2 in blocks at intervals of several hours to several days in order to minimize the data traffic to the central unit 2.

The central unit 2 comprises a data processing unit 21, in which the method described below can be carried out, and a database 22 for storing data points, model parameters, states, and the like.

In the central unit 2, an aging state model is implemented, which, as a hybrid or semi-hybrid model, can be data-based. The aging state model can be used regularly, i.e., for example, after the respective evaluation period has elapsed, in order to determine the instantaneous aging state of the relevant vehicle battery 41 of the assigned vehicle fleet based on the time profiles of the operating variables (in each case since the initial operation of the respective vehicle battery) and operating features determined therefrom. In other words, it is possible to determine an aging state of the relevant vehicle battery 41 based on the profiles of the operating variables of one of the vehicle batteries 41 of the motor vehicles 4 of the assigned vehicle fleet 3 and the operating features resulting or determined from these profiles of the operating variables.

The aging state (state of health, SOH) is the key variable to indicate a remaining battery capacity or remaining battery charge. The aging state represents a measure of the aging of the vehicle battery or of a battery module or of a battery cell and may be indicated as a capacity retention rate (SOH-C) or as an increase in internal resistance (SOH-R). The capacity retention rate SOH-C is given as the ratio of the measured instantaneous capacity to an initial capacity of the fully charged battery. The relative change in the internal resistance SOH-R increases with increasing aging of the battery.

Figure 2:
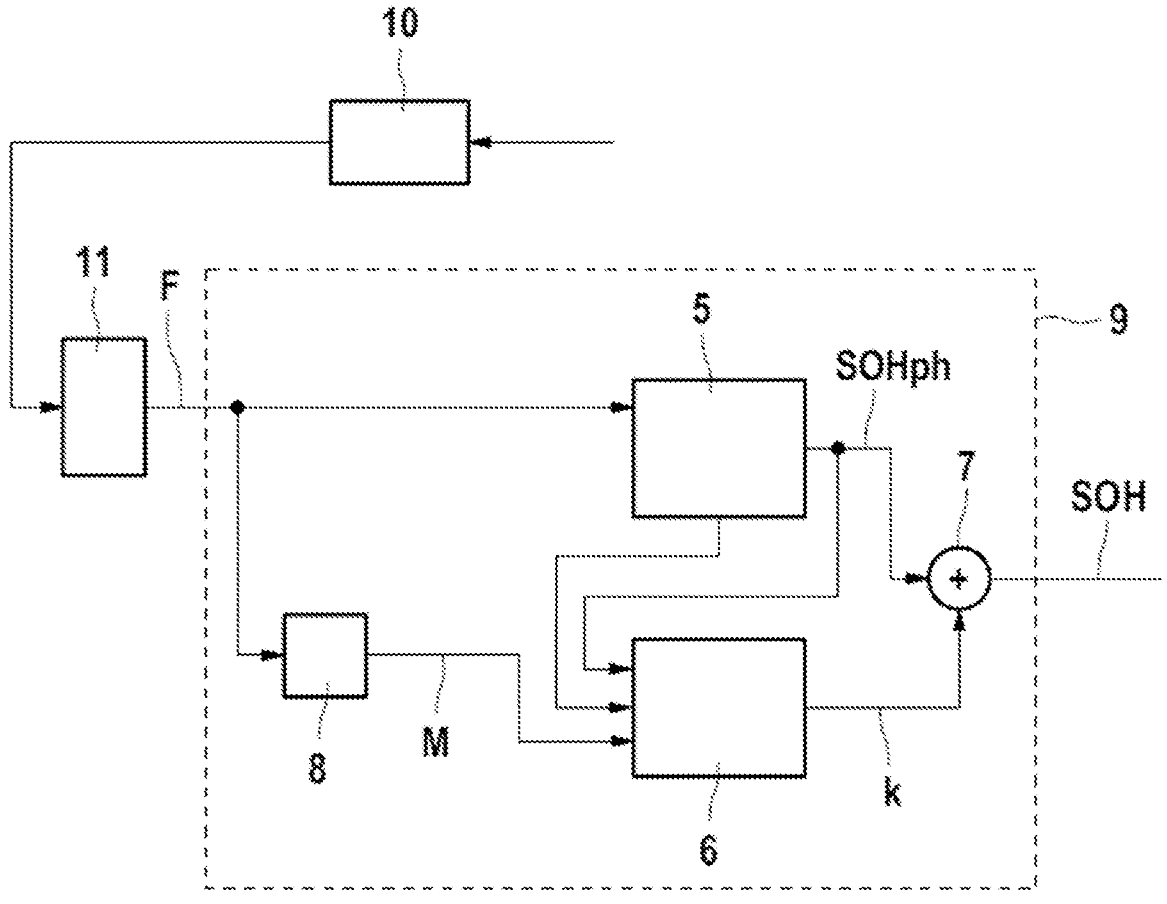
FIG. 2 a schematic illustration of a functional structure of a data-based aging state model.

FIG. 2 shows, by way of example, a functional structure of an embodiment of a data-based aging state model 9 comprising a physical aging model 5 and a data-based correction model 6. The latter obtain operating variables F or operating features M of a current evaluation period/aging time point (age of the vehicle battery since the time of initial operation). The operating features M of the current evaluation period/aging time point are generated in a feature extraction block 8 based on the time series of the operating variables F.

The physical aging model 5 is a non-linear mathematical model based on differential equations for mapping electrochemical processes. Such a model is known from the prior art and makes it possible, by evaluating differential equations, which the electrochemistry of the vehicle battery 41 with respect to aging-relevant model parameters by extrapolating the state based on the operating variable profiles (from the time of initial operation or a time at which the internal state is known, up to the current time and evaluation period to be considered), to determine a respective physical aging state SOHph. The evaluation of the physical aging model 5 of the aging state model 9 with operating variable profiles F, in particular since the start of the service life of the vehicle battery 41, results according to the time integration method in an internal state of the equation system of the physical differential equations that corresponds to a physical internal state of the vehicle battery 41.

Since the physical aging model 5 is based on physical and electrochemical principles, the internal states of the physical aging model comprise variables indicating physical properties, such as an equilibrium potential for an anode side reaction, a transfer coefficient for the anode side reaction with a first electrolyte, an anode polarization factor, an SEI conductivity, a deposition rate, an equilibrium potential for a cathode side reaction, a side reaction rate at the cathode; a current-dependent coefficient of mechanical stress in the active material of the anode, a weighting for the capacity loss due to loss of active material and the like. The internal states can be used to provide the physically based aging state SOHph in the form of a capacity retention rate (SOH-C) and/or an internal resistance increase rate (SOH-R) as linear or non-linear mapping of the internal states.

Such electrochemical battery models are known, for example, from the publications US 2016/023,566, US 2016/023,567 and US 2020/150,185.

However, the model values for the physical aging state SOHph provided by the physical aging model 5 are inaccurate in certain situations and it is therefore provided to correct them with a correction variable k. The correction variable k is provided by the data-based correction model 6.

For the determination of a corrected aging state SOH to be output, the outputs SOHph, k of the physical aging model 5 and of the correction model 6, which is preferably designed as a Gaussian process model, are applied together. In particular, they can be added in a summing block 7 or multiplied (not shown) in order to obtain the modeled aging state SOH to be output for a current evaluation period or aging time point. The confidence of the Gaussian process can furthermore be used in the case of addition as the confidence of the corrected aging value SOH of the hybrid model to be output.

On the input side, the correction model 6 obtains operating features M, which can be determined based from the profiles of the operating variables F in a feature extraction block 8 and can also comprise one or more of the internal electrochemical states of the differential equation system of the physical aging model.

Furthermore, on the input side, the correction model 6 can obtain the physical aging state SOHph obtained from the physical aging model 5. The operating features M of the current evaluation period are generated in the feature extraction block 8 based on the time series of the operating variables F. The operating features M furthermore include the internal states from the state vector the electrochemical physical aging model 5 as well as, advantageously, the physical aging state (SOHph).

The operating features M may, for example, comprise features relating to the evaluation period and/or accumulated features and/or statistical variables determined over the entire previous service life. In particular, features from histogram data that were created from the profiles of the operating variables can be determined as operating features. For example, histograms with respect to the battery current over the battery temperature and the charging state of the vehicle battery, a histogram of the battery temperature over the charging state of the vehicle battery, a histogram of the charging current over a battery temperature, and a histogram of a discharging current over the battery temperature can be created. Furthermore, the accumulated total charge (Ah), an average capacity increase during a charging process (in particular for charging processes in which the charge increase is above a threshold fraction [e.g., 20% ΔSOC] of the total battery capacity), the charging capacity as well as an extreme value (e.g., a local maximum) of the smoothed differential capacity during a measured charging process with sufficiently large stroke of the charging state (smoothed profile of dQ/dU: charge change divided by change in the battery voltage) or the accumulated driving power, respectively since the initial operation of the device battery, can be taken into account as operating features.

These variables are preferably converted such that they optimally characterize the real usage behavior, and are standardized in the feature space. The operating features M can be used altogether or only in part for the method described below.

Other embodiments of the data-based aging state model are likewise possible; for example, the data-based aging state model can be designed as a non-hybrid, purely data-based model based on a probabilistic or an artificial intelligence-based regression model, in particular a Gaussian process model, or a Bayesian neural network. The latter is trained to provide a modeled aging state SOH from an operating feature point determined by current operating features M of the current evaluation period/aging time point, wherein the operating features M are determined in a feature extraction block 8 based on the time series of the operating variables F.

The operating features M, and also further operating features generated in the feature extraction block 8, can moreover be supplied to the data-based correction model 6, which is preferably designed as a Gaussian process model. A reduction of the feature space, especially using a principal component (PCA) transformation, is advantageously upstream of the data-based correction model. The data-based correction model 6 serves to provide a correction variable k for applying the physical aging state determined by the data-based aging model, in order to obtain a corrected aging state SOH for the considered time point. The data-based correction model 6 is trained on the residual of the data-based aging model 5 and trained and validated with real measured aging states as labels.

Furthermore, in the data-based correction model 6, electrochemical states resulting from the evaluation of the data-based aging model for an aging state can be taking into account as input variables. Electrochemical states can, for example, comprise one or more of the following variables: an SEI layer thickness, a change in cyclable lithium due to anode/cathode side reactions, a rate of rapid intake of electrolyte solvents, a rate of slow intake of electrolyte solvents, a rate of lithium deposition, a loss of active anode material and a loss of active cathode material, as well as information on impedances or the internal resistances.

The aging state model 9 can be applied in the central unit 2, wherein operating variable profiles F of the individual vehicles 4 are transmitted to the central unit 2. Alternative embodiments can provide that the aging state model 9 is applied in the vehicle by transmitting corresponding model parameters to the respective vehicle.

For the prediction, a usage pattern model 10 can be provided, which can predict operating variable profiles, in particular of the battery current and of the battery temperature, as described below. Using a battery performance model 11 known per se, these profiles can be supplemented with further operating variable profiles, in particular of the battery voltage and of the charging state.

Figure 3:
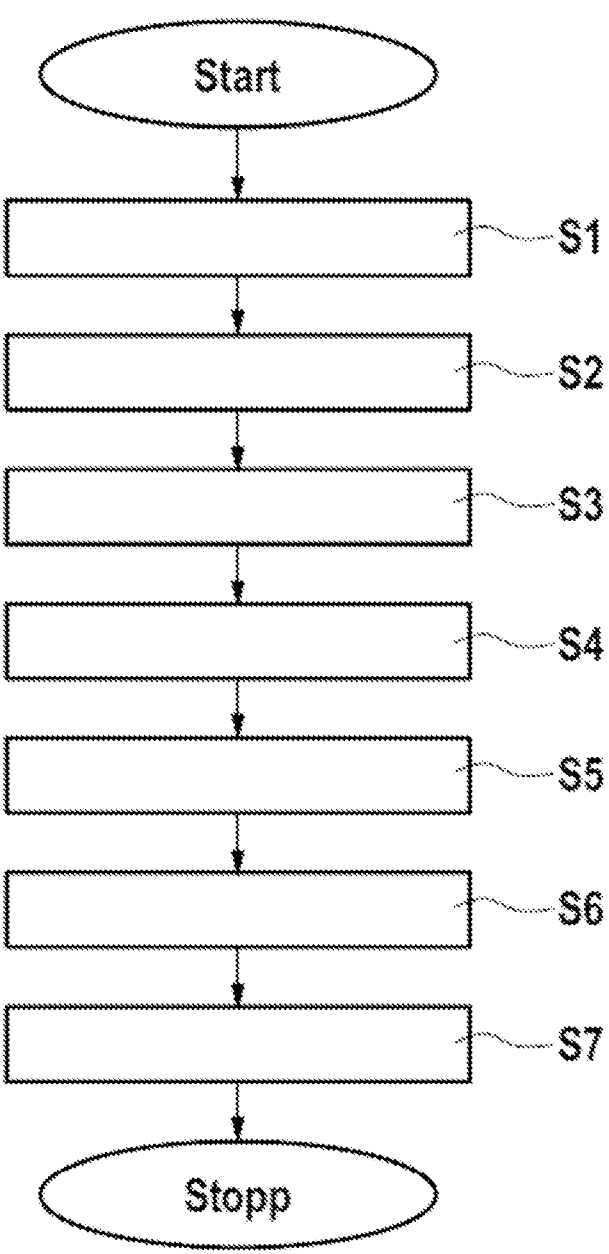
FIG. 3 a flow chart for illustrating a method for creating a predicted load profile for determining a predicted aging state or a predicted aging state profile or a remaining residual service life.

In connection with FIG. 3, a method is now described that can be used to predict an aging state. The prediction is based on the time integration-based aging state model 9 described above, which can evaluate operating variable profiles with high resolution. For the prediction, a load pattern from artificial operating variable profiles is now predicted into the future, either up to a predetermined prediction horizon of one month, three months, six months, one year, or up to an expected end of service life of the vehicle battery 41.

The method initially provides in step S1 to capture the user-specific operating variable profiles up to a current evaluation time point. The operating variable profiles F comprise the profiles of the battery current, the battery voltage, the battery temperature and the charging state.

Thereafter, in step S2, the operating variable profiles within a predetermined period of time up to the current time point, of e.g., one month, three months, six months, or the like are segmented in terms of cycles. The cycles can correspond to a division of the operating variable profiles into successive time periods of predetermined duration.

Based on criteria, the cycles can respectively also be differentiated as an operating cycle, a charging cycle or a rest cycle of variable durations. Operating cycles correspond to time periods of a continuous operation, i.e., a continuous discharging current of greater than OA. In this respect, the interruptions of a discharging current of less than a predetermined minimum time, such as 60 seconds, can be disregarded in order to hide traffic light stops or recuperation phases and still assign them to the relevant operating cycle. Furthermore, rest cycles can be identified as time periods of a constant battery current of 0A, the duration of which is greater than a predetermined minimum time. The contiguous time periods in which a charging current flows into the vehicle battery 41 can be identified as charging cycles.

The cycles can be classified into cycle profiles in a subsequent step S3. The cycle profiles can be divided into one or more operating cycle profiles, a rest cycle profile, and one or more charging cycle profiles. In this case, the operating cycle profiles can be classified based on rules according to load features, e.g., with regard to their average power throughput during the duration of the time period assigned to the operating cycle profile, their duration, and the like, in order to differentiate them by the amount of the average power draw from the relevant vehicle battery 41. For example, the operating cycle profiles can be divided into ranges of up to 10 Ah, up to 20 Ah, and above 20 Ah in order to characterize the type of load on the vehicle battery by the assignment to a corresponding operating cycle profile. Furthermore, the operating cycle profiles can also be characterized or differentiated with regard to the average battery temperature during the assigned time period, such as an operation below 40° C. and an operation above 40° C.

All cycles in which the power draw is less than a predetermined threshold value, e.g., 0.1 Ah per time period, can be assigned a rest cycle profile.

Cycles in which a charging current continuously flows into the vehicle battery 41 can be assigned to a charging cycle profile. Charging cycle profiles can be differentiated with regard to the flowing charging current, for example charging currents up to 11 kW, and charging currents above 11 kW can correspond to various corresponding charging cycle profiles.

The operating variable profiles F can now be analyzed accordingly and assigned, time period by time period, to different cycle profiles.

Alternatively, the assignment of the cycles to cycle profiles can be performed using a clustering method based on the load features, said clustering method respectively assigning the cycles based on the load features to one of a plurality of operating cycle profiles, a rest cycle profile, or one of a plurality of charging cycle profiles.

A sequence of cycle profiles for the individual time periods of the same or variable duration results for both procedures.

The status evaluation can take place based on rules or models, e.g., a rest cycle is detected as a load-free state, e.g., if ignition==off.

Dynamic time-series data is probabilistically learned from historical fleet data of the user after parking phases have been eliminated. The projection takes place here especially with deep neural networks, especially Bayesian networks or LSTM approaches, preferably using attention mechanisms.

In a subsequent step S4, the sequence of the cycle profiles is used to create a hidden Markov model. In this case, the nodes or states of the hidden Markov model correspond to the individual possible cycle profiles, such as the operating cycle profiles B1, B2, B3 . . . , the charging cycle profiles L1, L2 . . . and the rest cycle profile. The nodes of the cycle profiles are interconnected via edges with transition probabilities p11, p12, . . . , p54, p55. This sampling or simulation via HMM is also possible at a low frequency and can take place, for example, once per hour up to 4 to 6 times per day. In this case, user decisions are to be modeled and simulated that describe use scenarios (parking, charging, driving) and thus have a direct effect on the time series of the load profiles since the states of the HMM are directly linked to time-series data, wherein time-series patterns are learned via large fleet data in a driver-specific manner.

Figure 4:
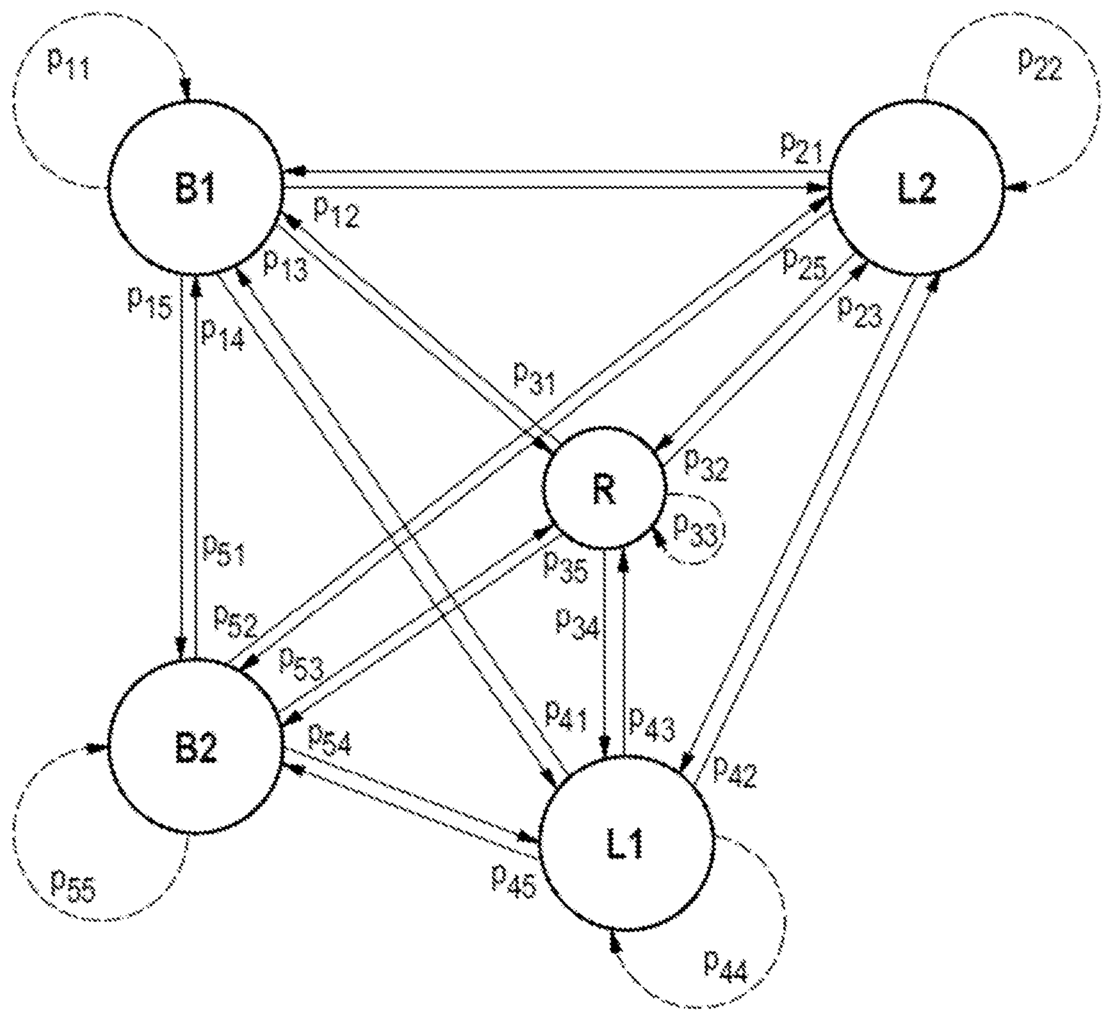
FIG. 4 an illustration of an exemplary hidden Markov model with transition probabilities as the basis for creating a predicted cycle profile for determining predicted operating variable profiles.

FIG. 4 shows, by way of example, a graphical illustration of a hidden Markov model 20 with nodes 21 and edges 22. The nodes 21 are denoted by the respective cycle profile and the edges 22 are provided with exemplary information on the transition probabilities. The transition probabilities from one cycle profile to the same cycle profile are indicated with dashes if the cycles are predetermined as time periods of constant duration and two successive cycle profiles can thus be the same. The hidden Markov model thus comprises at least one state (node) linked to a charging cycle profile or at least an operating cycle profile and a rest cycle profile, wherein transition probabilities and optionally observation probabilities are learned in a user-specific manner.

In a subsequent step S5, a sequence of cycle profiles according to a Monte-Carlo-Markov simulation or using the transition matrix of the hidden Markov model according to a random selection according to the transition probabilities predetermined for the current node to subsequent cycle profiles can now be performed for a predetermined prediction period, which lasts up to a predetermined prediction horizon. This results in a sequence of predicted cycle profiles up to a prediction horizon. A future load projection on the basis of the HMM and the dynamic time-series prediction of the operating variables thus results, wherein rest and operating and/or charging cycles are again assembled as dynamic load phases via state sampling from the HMM. The load projection can be provided with an expected value and confidence or quantile information. Furthermore, range prediction can take place, especially on the basis of quantile prediction of the load projection or on the basis of the expected value.

In particular, in step S6, a profile operating variable profile, in particular in the form of a battery current profile and a battery temperature profile, is assigned to each of the cycle profiles. From the battery current profile and the battery temperature profile, profiles of the battery voltage and of the charging state can be calculated using a suitable battery performance model. The operating variable profiles thus determined can be used as input variables for the hybrid aging state model in order to determine a corresponding predicted profile of the aging state.

The profile operating variable profile can be predetermined for each of the cycle profiles so that a continuous time series of the operating variable profiles results from the sequence of cycle profiles.

The creation of the battery current profile for the respective cycle profile can be determined from a historical operating variable profile of the relevant vehicle battery in a cycle corresponding to the respective cycle profile. In particular, in the case of clusters of the cycles assigned to the corresponding cycle profile, the operating variable profile of the cycle assigned to the cycle closest to the centroid of the cluster can be assigned to the respective cycle profile.

For a rest cycle profile, the battery current is 0A. A battery temperature profile in this case substantially corresponds to the ambient temperature profile, which can be derived from weather forecasts and seasonal average temperatures.

By concatenating profile operating variable profiles thus determined, a predicted operating variable profile can accordingly be constructed, which best simulates a possible operating variable profile and would cause aging that would result with continued use of the vehicle with the usage profile of the driver of the vehicle.

The predicted operating variable profile can be used in a subsequent step S7 to predict the aging state, in particular to determine a predicted aging state profile. The predicted aging state profile can, for example, be determined in this case by the data-based or hybrid aging state model 9.

What is claimed is:

1. A method for operating a vehicle including a device battery, the method comprising:

transmitting at least one operating variable of the device battery of the vehicle from a communication module of the vehicle to a central unit operably connected to the communication module, the central unit including a data processing unit;

predicting a predicted aging state of the device battery using a predetermined aging state model stored on the central unit by:

determining, using the data processing unit, successive cycles of the device battery based on the at least one operating variable of the device battery, the successive cycles including (i) at least one operating cycle of the device battery, (ii) at least one rest cycle of the device battery, and (iii) at least one charging cycle of the device battery;

determining a respective cycle profile of a plurality of cycle profiles, using the data processing unit, for each of the successive cycles so that a sequence of cycle profiles of the plurality of cycle profiles is obtained, each cycle profile of the plurality of cycle profiles characterizes a type of use of the device battery during a corresponding successive cycle and/or an amount of a load on the device battery during the corresponding successive cycle;

determining a frequency distribution of transitions from one cycle profile of the plurality of cycle profiles to a subsequent cycle profile of the plurality of cycle profiles in the sequence of cycle profiles as a hidden Markov model, using the data processing unit;

determining, using the data processing unit, a predicted sequence of cycle profiles by successively, randomly selecting cycle profiles from the sequence of cycle profiles according to the frequency distribution of transitions starting from a most recently selected cycle profile of the sequence of cycle profiles;

determining, using the data processing unit, a predicted operating variable profile by assigning at least one profile operating variable profile of a plurality of profile operating variable profiles to the cycle profiles of the predicted sequence of cycle profiles, the at least one profile operating variable profile including data representing a battery current of the device battery and/or a battery temperature of the device battery based on previously measured operating variables; and determining the predicted aging state of the device battery by processing the predicted operating variable profile as in input to the predetermined aging state model;

determining, using the data processing unit, (i) a residual range of the vehicle based on the predicted aging state of the device battery, and (ii) an operating limit for the device battery based on the predicted aging state of the device battery, the operating limit including at least one of a current limitation and a thermal management strategy;

transmitting the residual range and the operating limit from the central unit to the communication module, and supplying the residual range and the operating limit to a control unit of the vehicle that is operably connected to the communication module and an electric motor of the vehicle; and operating, using the control unit of the vehicle, the device battery based on the residual range and the operating limit to supply electrical energy to the electric motor of the vehicle for moving the vehicle, such that the device battery is operated according to a corresponding amount of load based on the predicted aging state.

2. The method according to claim 1, wherein the plurality of cycle profiles comprises (i) one or more operating cycle profiles characterizing the type of use of the device battery and/or the amount of the load on the device battery during the at least one operating cycle of the device battery, (ii) one or more rest cycle profiles characterizing the type of use of the device battery and/or the amount of the load on the device battery during the at least one rest cycle of the device battery, and (iii) one or more charging cycle profiles characterizing the type of use of the device battery and/or the amount of the load on the device battery during the at least one charging cycle.

3. The method according to claim 2, wherein:

determining the respective cycle profile for each of the successive cycles takes place using a rule-based classification method or a clustering method based on load features; and the load features comprise at least one aggregated variable from the at least one operating variable.

4. The method according to claim 3, wherein determining the respective cycle profile for each of the successive cycles includes:

detecting the at least one rest cycle during which there is no current flow from the device battery.

5. The method according to claim 1, wherein the at least one operating variable of the device battery comprises the battery current, the battery temperature, a battery voltage and a charging state.

6. The method according to claim 1, wherein the plurality of profile operating variable profiles assigned to the cycle profiles respectively correspond to an operating variable profile of a most recent cycle assigned to a corresponding cycle profile of the plurality of cycle profiles.

7. The method according to claim 3, wherein the plurality of profile operating variable profiles assigned to the cycle profiles respectively correspond to an operating variable profile of the successive cycles assigned to a corresponding cycle profile of the plurality of cycle profiles and closest to centroid of an associated cluster from the clustering method.

8. The method according to claim 1, wherein the hidden Markov model is created, such that in which the cycle profiles of the plurality of cycle profiles form nodes that are interconnected via edges, to which are assigned frequencies of transitions from the one cycle profile to the subsequent cycle profile.

9. The method according to claim 1, wherein determining the predicted aging state based on the predicted operating variable profile is performed using the predetermined aging state model comprising an electrochemical model which is formed by a non-linear differential equation system and is can be solved via time integration.

10. The method according to claim 1, further comprising: performing predictive maintenance on the vehicle based on the residual range and the operating limit.

11. The method according to claim 1, further comprising: determining, using the data processing unit, a remaining residual service life of the device battery based on the residual range and the operating limit; and increasing or decreasing a number of remaining rapid charging cycles of the device battery and/or blocking rapid charging cycles of the device battery based on the remaining residual service life.

* * * * *